(12) United States Patent
Pamart et al.

(10) Patent No.: US 12,374,845 B2
(45) Date of Patent: Jul. 29, 2025

(54) SUBSTRATE FOR CONTACTING AT LEAST ONE ELECTRICAL PIN OF A CHARGING INLET

(71) Applicant: Tyco Electronics France SAS, Pontoise (FR)

(72) Inventors: Olivier Pamart, Pontoise (FR); Bruno Dupont, Pontoise (FR); Romain Anselmini, Pontoise (FR)

(73) Assignee: TE Connectivity Solutions GmbH, Schaffhausen (CH)

( * ) Notice: Subject to any disclaimer, the term of this patent is extended or adjusted under 35 U.S.C. 154(b) by 257 days.

(21) Appl. No.: 17/952,616

(22) Filed: Sep. 26, 2022

(65) Prior Publication Data

US 2023/0096310 A1 Mar. 30, 2023

(30) Foreign Application Priority Data

Sep. 27, 2021 (FR) ...................................... 2110170

(51) Int. Cl.
*H01R 31/06* (2006.01)
*B60L 53/16* (2019.01)
(Continued)

(52) U.S. Cl.
CPC .............. *H01R 31/06* (2013.01); *B60L 53/16* (2019.02); *G01R 31/70* (2020.01); *H01R 13/50* (2013.01);
(Continued)

(58) Field of Classification Search
CPC .... H01R 31/06; H01R 13/50; H01R 13/6273; H01R 43/26; H01R 2201/26;
(Continued)

(56) References Cited

U.S. PATENT DOCUMENTS

| 5,264,796 | A | 11/1993 | Klassen et al. |
| 2001/0003685 | A1 | 6/2001 | Aritani |

(Continued)

FOREIGN PATENT DOCUMENTS

| CN | 210897752 U | 6/2020 |
| DE | 102018204271 A1 | 9/2019 |

(Continued)

OTHER PUBLICATIONS

Korean Office Action dated Mar. 29, 2024 with English translation, corresponding to Application No. 10-2022-0121677, 13 pages.

(Continued)

*Primary Examiner* — Alvaro E Fortich
(74) *Attorney, Agent, or Firm* — Barley Snyder (57) ABSTRACT

A substrate for contacting an electrical pin arranged in a housing includes a base having a recess receiving the electrical pin, a metal leadframe having a contacting region electrically and/or thermally contacting the electrical pin, and a contact pin extending along a mating direction in a plane parallel to the metal leadframe and configured to electrically contact a mating contact pin of a mating connector. The metal leadframe is rigidly fixed to the base to prevent a relative movement between the metal leadframe and the substrate. The substrate is movable with respect to the housing along a locking direction from an unlocked position where the substrate is not locked to the housing to a locked position in which the substrate is locked to the housing. A movement of the contacting region with respect to the electrical pin is prevented in the locked position.

19 Claims, 5 Drawing Sheets

(51) Int. Cl.
  *G01R 31/70* (2020.01)
  *H01R 13/50* (2006.01)
  *H01R 13/627* (2006.01)
  *H01R 43/26* (2006.01)

(52) U.S. Cl.
  CPC ......... *H01R 13/6273* (2013.01); *H01R 43/26* (2013.01); *H01R 2201/26* (2013.01)

(58) Field of Classification Search
  CPC ..... H01R 13/629; H01R 13/639; B60L 53/16; G01R 31/70; H05K 3/202; H05K 2201/09118; H05K 1/184; H05K 2201/10189; H05K 2203/162; H05K 2203/167; Y02T 10/70; Y02T 10/7072; Y02T 90/14; B60Y 2200/91; B60Y 2200/92; B60Y 2410/10; B60Y 2410/115
  See application file for complete search history.

(56) References Cited

U.S. PATENT DOCUMENTS

| | | | |
|---|---|---|---|
| 2018/0331450 A1* | 11/2018 | Zhu | H01R 13/436 |
| 2019/0260146 A1 | 8/2019 | Ralf et al. | |
| 2019/0293493 A1 | 9/2019 | Meissner et al. | |
| 2019/0335584 A1 | 10/2019 | Burani et al. | |
| 2019/0375300 A1 | 12/2019 | Lyon | |
| 2020/0412069 A1 | 12/2020 | Malandain et al. | |

FOREIGN PATENT DOCUMENTS

| | | |
|---|---|---|
| EP | 2338722 A2 | 6/2011 |
| EP | 2783902 A2 | 10/2014 |
| EP | 3587169 A1 | 1/2020 |
| JP | 2019521486 A | 7/2019 |
| JP | 2019168450 A | 10/2019 |
| WO | 2018001719 A1 | 1/2018 |
| WO | 2020030206 A1 | 2/2020 |

OTHER PUBLICATIONS

Japanese Office Action dated Oct. 31, 2023 with English translation, corresponding to Application No. 2022-149795, 10 pages.
Preliminary Research Report and Written Opinion with English Translation, Application No. FR 2110170, Dated: Jun. 14, 2022, 16 pages.
Indian Examination Report dated Oct. 1, 2024, corresponding to Application No. 202244054314, 5 pages.

* cited by examiner

SUBSTRATE FOR CONTACTING AT LEAST ONE ELECTRICAL PIN OF A CHARGING INLET

CROSS-REFERENCE TO RELATED APPLICATIONS

This application claims the benefit of the filing date under 35 U.S.C. § 119(a)-(d) of France Patent Application No. 2110170, filed on Sep. 27, 2021.

FIELD OF THE INVENTION

The present invention relates to a substrate for contacting at least one electrical pin arranged in a housing of a charging inlet for an electric or hybrid vehicle. The present invention further relates to an assembly of such substrate and housing, as well as to a method for assembling them.

BACKGROUND

In electric or hybrid vehicles, vehicles are propelled exclusively or partly by one or more electric motors and powered by electrical storage devices, such as a rechargeable battery. The one or more batteries of an electric or hybrid vehicle are rechargeable by a cable. The cable is connected to an electric charging station and terminates by a charging plug connectable to a charge inlet of the vehicle. The charging inlet comprises a housing provided with a plurality of electrical pins for transmitting electrical energy.

There are several vehicle charging plug/inlet standards adapted to the geographical area in which the vehicle is marketed. For example, it is known to use a combined charging system (CCS) to quickly charge an electric vehicle with direct current (DC). This type of charging socket can have both DC and single-phase or three-phase alternating current (AC) pins. A DC power supply allows for relatively fast, and therefore advantageous, battery recharging due to its electrical power of at least 150 kW and a voltage of more than 400V.

The known charging inlets further comprise two signals pins, one proximity pilot (PP) and one control pilot (CP). These signal pins needs to be electrically connected to a mating connector, in particular to the vehicle's charging control system.

Moreover, during charging of the battery, the electrical pins inevitably heat up as a result of ohmic losses. For safety reasons, it is known to monitor the temperature of the electrical pins of the charging inlet of the vehicle by a temperature sensor contacting a respective electrical pin. These temperature sensors also need to be electrically connected to the vehicle's charging control system.

It is known to realize the electrical connection between the electrical pins and a connector of the vehicle's charging control system by a printed circuit board fixedly installed in the housing of the vehicle's charging inlet. The printed circuit board is fixedly positioned so as to be electrically and/or thermally in contact with the electrical pins of the vehicle's charging inlet.

The reliability of the electrical connection is impacted by the quality of the electrical and/or thermal contact between the printed circuit board and the electrical pins. Hence, it is convenient to lock the electrical pins in the housing of the vehicle's charging inlet in order to prevent movement of the electrical pins with respect to the printed circuit board.

In the state of the art, the locking of the electrical pins is achieved by a locking device, made of plastic, slidably movable from an unlocked position, wherein the locking device is not locked to the housing, to a locked position, wherein the locking device is locked to the housing and prevents a movement of the electrical pins with respect to the housing and the printed circuit board. It is therefore necessary to first fixedly attached the printed circuit board to the housing. Then, the locking device needs to be provided on the printed circuit board. The locking device is initially mounted in its unlocked position. A translation of the locking device is then necessary to move the locking device in its locked position. This type of state of the art assembly requires a relatively large number of operations for the operator, and some operations are not, or not easily, automatable.

There is a need for simplifying the mounting of the printed circuit board and the locking device to a charging inlet. Furthermore, it is not readily possible to detect the position of the locking device with respect to the housing, and thus to determine whether the locking device has been correctly slid in its locked position, as the locking device is usually hidden by a cover. A visual control by an operator is thus not eased, or even rendered impossible.

SUMMARY

A substrate for contacting an electrical pin arranged in a housing includes a base having a recess receiving the electrical pin, a metal leadframe having a contacting region electrically and/or thermally contacting the electrical pin, and a contact pin extending along a mating direction in a plane parallel to the metal leadframe and configured to electrically contact a mating contact pin of a mating connector. The metal leadframe is rigidly fixed to the base to prevent a relative movement between the metal leadframe and the substrate. The substrate is movable with respect to the housing along a locking direction from an unlocked position where the substrate is not locked to the housing to a locked position in which the substrate is locked to the housing. A movement of the contacting region with respect to the electrical pin is prevented in the locked position.

BRIEF DESCRIPTION OF THE DRAWINGS

The invention will now be described by way of example with reference to the accompanying Figures, of which.

DETAILED DESCRIPTION OF THE EMBODIMENT(S)

Although the embodiments will be described below in relation to particular examples, the invention is not limited to these embodiments and numerous alterations to the disclosed embodiments can be made without departing from the scope of this invention. The various embodiments and examples include individual features that can be freely combined with each other to obtain further embodiments or examples according to the invention.

Figure 1:
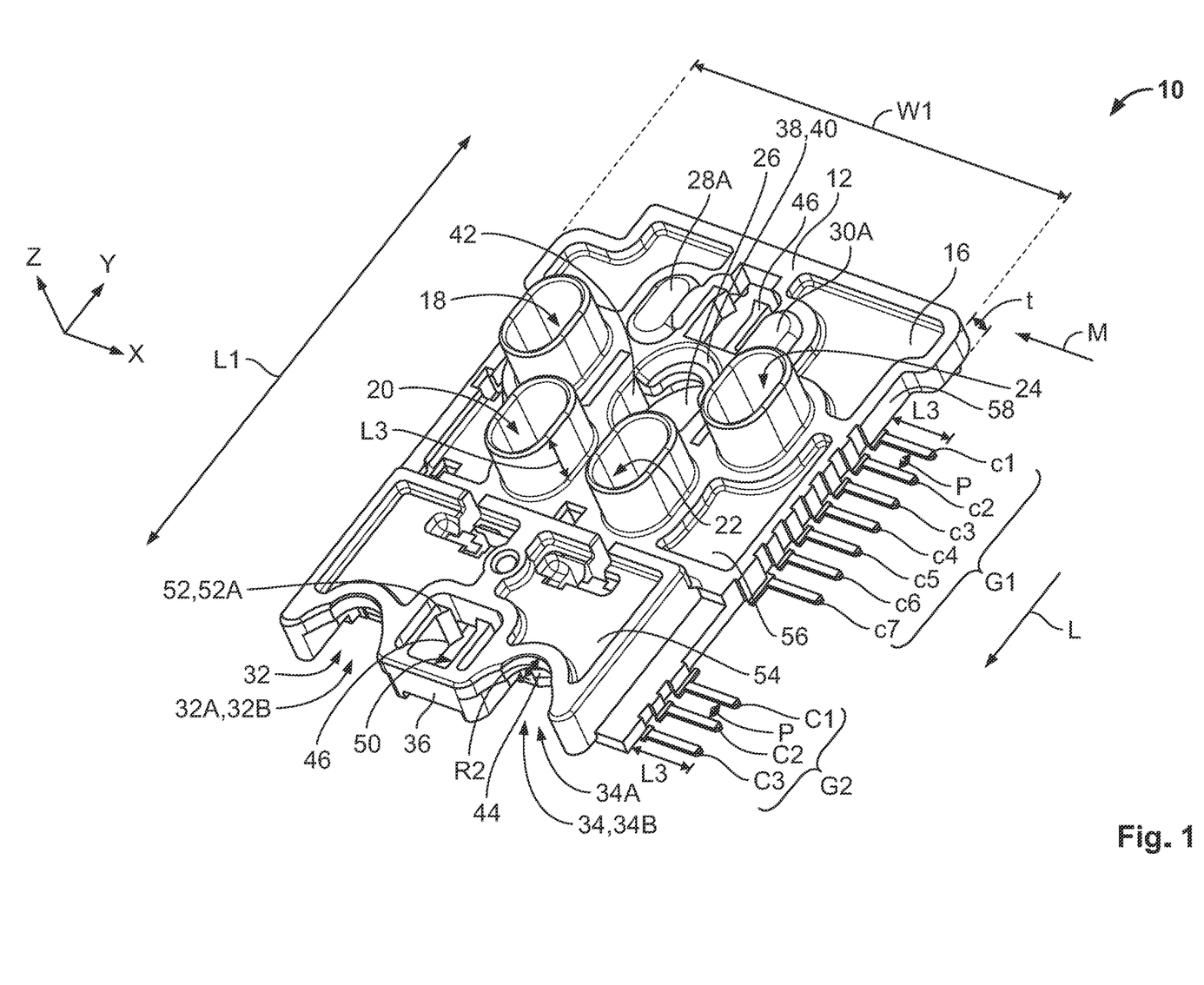
FIG. 1 is a perspective view of a first face of a substrate according to an embodiment.
Figure 2:
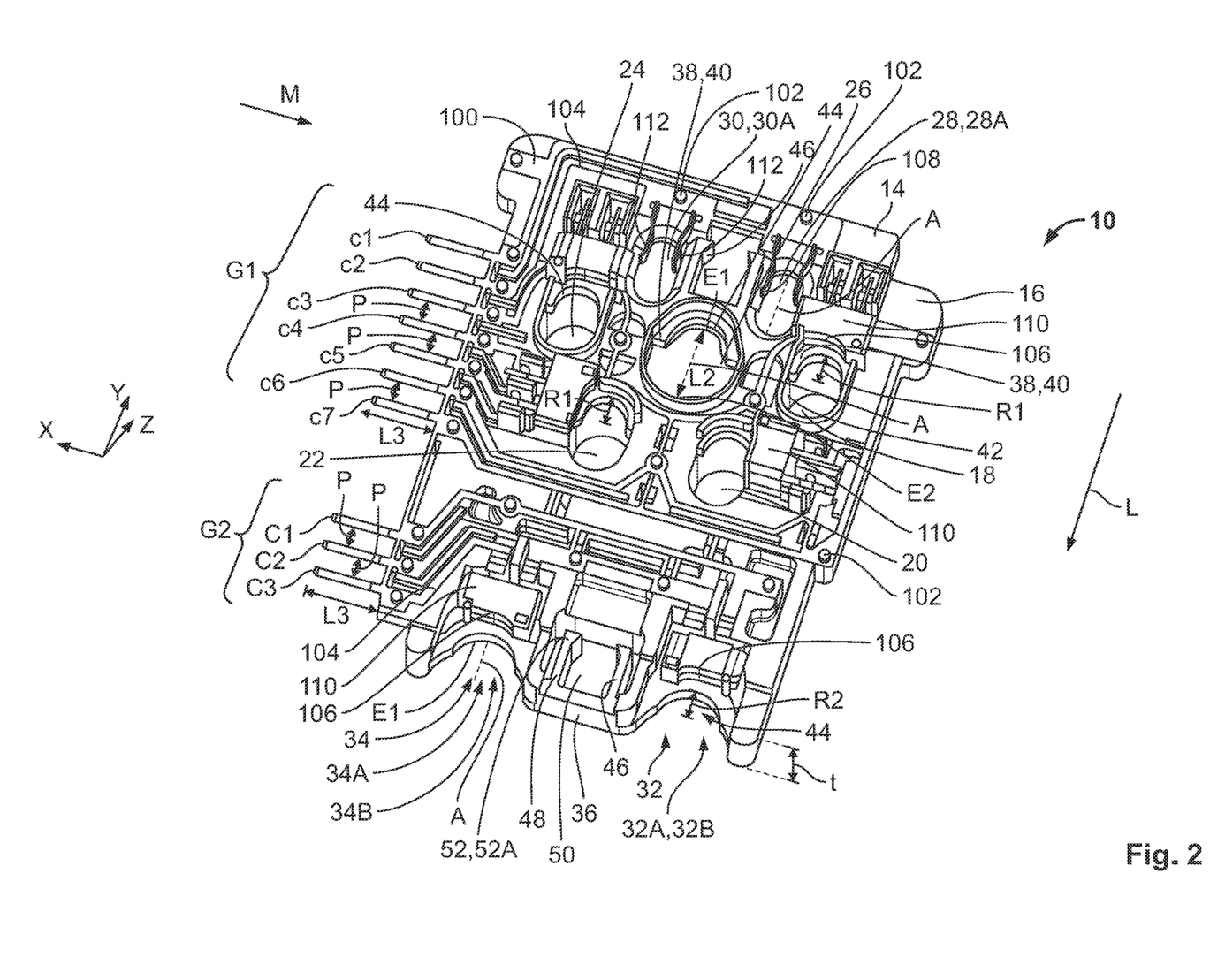
FIG. 2 is a perspective view of a second face of the substrate of FIG. 1, opposite the first face.

A substrate 10 according to a first embodiment of the present invention is represented in FIG. 1 and FIG. 2. FIG. 1 illustrates a first face 12 of the substrate 10 while FIG. 2 illustrates a second face 14 of the substrate 10, opposite to the first face 12. FIG. 1 and FIG. 2 are described jointly hereafter.

The substrate 10 comprises an electrically insulating base 16 ("base 16" thereafter), such as a molded plastic base 16, substantially extending in a plan (XY) along a length "L1" with respect to the X-axis and a width "W1" with respect to the Y-axis. The base 16 is dimensioned so as to be insertable in a housing of a charging inlet for an electric or hybrid vehicle, as partially illustrated in FIG. 3 and further described thereafter.

The substrate 10 according to the present invention is provided with at least one recess configured for receiving an electrical pin, also referred as "contact" or "terminal" in the following description, of a housing of a charging inlet (partially represented in FIG. 3) for an electric or hybrid vehicle.

In the example of the first embodiment, the base 16 is provided with five through recesses 18, 20, 22, 24, 26, as shown in FIGS. 1 and 2. The four recesses 18, 20, 22, 24 are configured for respectively receiving an AC electrical pin. The central recess 26 is configured for a grounding pin.

In the example of the first embodiment, the base 16 further comprises two non-through recesses 28, 30 extending from the second surface 16 partially along a direction parallel to the thickness "t" of the substrate 10. Hence, the non-through recesses 28, 30 are only visible in FIG. 2 that illustrates the second surface 16. In FIG. 1 instead, only the respective base 28A, 30A of the non-through recesses 28, 30 are visible. The two non-through recesses 28, 30 are configured for receiving signals pins, respectively one proximity pilot (PP) and one control pilot (CP) pin.

In the example of the first embodiment, the base 16 is also provided with two open recesses 32, 34 respectively having an open side 32A, 34B. The open recesses 32, 34 respectively form a notch 32B, 34B extending along a longitudinal axis A from one lateral side 36 of the substrate 10. The lateral side 36 connects the first surface 12 and the second surface 16 of the substrate 10. The two open recesses 32, 34 are configured for respectively receiving a DC electrical pin.

In the example of the first embodiment shown in FIGS. 1 and 2, each of the recesses 18, 20, 22, 24, 26, 28, 30 has an oblong shape along the longitudinal axis A. The longitudinal axis A of the recesses 18, 20, 22, 24, 26, 28, 30 are thus parallel to each other. Each recess 18, 20, 22, 24, 26, 28, 30 has a longitudinal length L2 along its longitudinal axis A. For sake of clarity, only the longitudinal length L2 of the central recess 26 is represented in FIG. 2. The longitudinal length L2 is defined along the longitudinal axis A between an end-side E1 and an opposite end-side E2 of the respective recess.

According to the present invention, the substrate 10 is configured to provide a locking function for preventing a movement of electrical pins with respect to a housing of a charging inlet, in particular during a mating process of the charging inlet with a mating connector.

In the example of the first embodiment, the locking function of the substrate 10 is realized at the recesses 18, 20, 22, 24, 26 by respective snap-fit fastening devices 38. Each snap-fit fastening device 38 is formed at the end-side E1 by a shoulder 40 partially protruding from a lateral wall 42 that defines the corresponding recess 18, 20, 22, 24, 26. The shoulder 40 extends in the plan (XY). The shoulder 40 defines a semi-circular notch 44 of radius R1 at the end-side E1 in the corresponding recess 18, 20, 22, 24, 26. The radius R1 is dimensioned so as to be substantially the same as a radius of an electrical pin insertable in each corresponding recess 18, 20, 22, 24, 26. Hence, the respective shoulder 40 allows reducing the dimension of each recess 18, 20, 22, 24, 26 to complementary dimensions of a circumference of an electrical pin for retaining the substrate 10 by friction to said electrical pin (not represented in FIG. 1 and FIG. 2, see FIG. 3 described thereafter). The dimensions of each recess 18, 20, 22, 24, 26 in the plan (XY) of the substrate 10 are thus greater at the end-side E2 than at the opposite end-side E1 along the longitudinal axis A. It allows introducing an electrical pin, in particular an AC terminal, in each recess 18, 20, 22, 24, 26 at the end-side E2 and maintaining by friction said electrical pin to the substrate 10 at the end-side E1 by the snap-fit fastening device 38. To this end, the substrate 10 needs to be moved along a locking direction L with respect to a charging inlet. The locking movement of the substrate 10 is further described in the following with respect to FIG. 3, FIG. 4 and FIG. 5. It is noted that the locking direction L is parallel to the longitudinal axis A, i.e. to the direction of longitudinal extension of the recesses.

The two open recesses 32, 34 dedicated to DC contact are also provided with a semi-circular notch 44, as shown in FIG. 2. As DC contacts are usually larger than AC contacts, the radius R2 of the semi-circular notch 44 of each open recesses 32, 34 can be greater than the radius R1, which is adapted to the dimension of an AC contact. The two open recesses 32, 34 are provided with greater dimensions at the open side 32A, 34B than at the semi-circular notch 44. The semi-circular notch 44 is disposed opposite to each open side 32A, 34B along the longitudinal axis A of the respective open recesses 32, 34. Hence, in a similar manner than for the recesses 18, 20, 22, 24, 26, it allows introducing an electrical pin, in particular a DC terminal, in each open recess 32, 34 from the open side 32A, 34B and maintaining by friction said electrical pin to the substrate 10 at the semi-circular notch 44.

In the example of the first embodiment, for improving the sealing properties in a housing of a charging inlet, the recesses 18, 20, 22, 24 of the substrate 10 are each provided with a surrounding wall of length L3 extending perpendicularly from the first face 10 of the base 16, as shown in FIG. 1.

Figure 3:
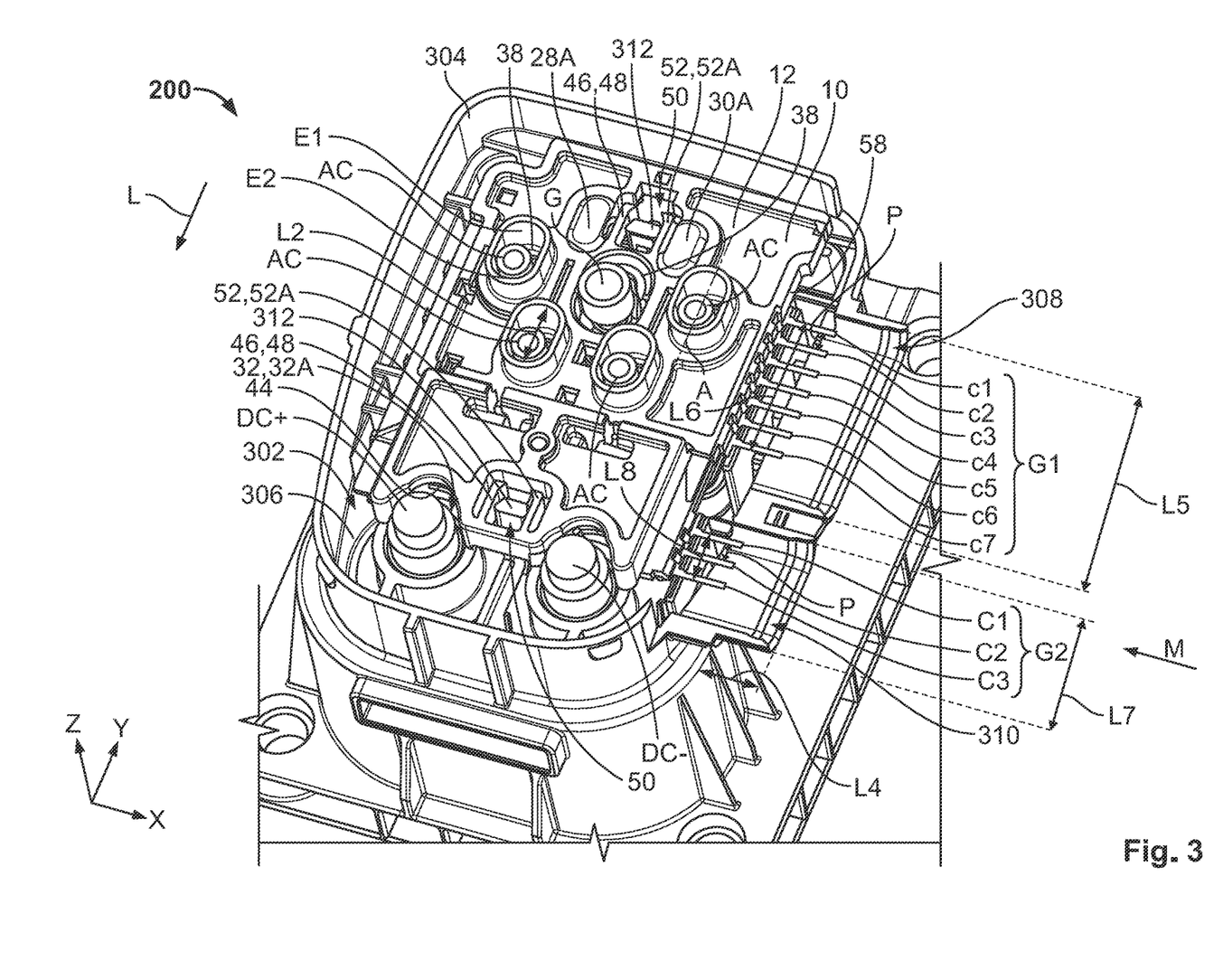
FIG. 3 is a perspective view of an assembly of the substrate of FIG. 1 with a housing of a charging inlet for an electric or hybrid vehicle.

Furthermore, in the exemplary first embodiment, the substrate 10 comprises two snap-fit devices 46 configured to be engaged with complementary retaining device of a housing of a charging inlet (not represented in FIG. 1 and FIG. 2, see FIG. 3 described thereafter). Each of the snap-fit devices 46 comprises two latching arms 48 extending from the base 16 along the longitudinal axis A in an aperture 50 of the substrate 10. The latching arms 48 terminates by one free-end 52 having a hook portion 52A. The latching arms 48 allows a deflection of the snap-fit device 46 to lock the hook portion 52A to a complementary retaining device of a housing of a charging inlet (not represented in FIG. 1 and FIG. 2, see FIG. 3 described thereafter). The locking function of the substrate 10 can be reliably achieved by a secure and easy to use fastening device, that does not even require the assembly of additional components, like screws.

The base 16 can comprise further recesses provided in the first face 12, such as indicated by the reference signs 54, 56 in FIG. 1, to reduce the amount of material necessary for molding the substrate 10 and lighten it.

According to the present invention, in addition of the locking function, the substrate 10 is also configured for providing a contacting function. For instance, the contacting function is required to electrically connect the signal pins of a charging inlet with a mating connector of the vehicle's control system. The contacting function can also relate to the connection of temperature sensors for monitoring the temperature of AC and DC terminals of a charging inlet.

According to the present invention, the contacting function of the substrate 10 is achieved by a metal leadframe 100 provided on the second face 16, as shown in FIG. 2. The metal leadframe 100 is rigidly fixed to the substrate 10 so as to prevent a relative movement between the metal leadframe 100 and the substrate 10. Consequently, a movement of the substrate 10 causes the same simultaneous movement to the metal leadframe 100. The substrate 10 and the leadframe 100 can thus be moved jointly.

In one manufacturing variant, the plastic base 16 can be molded by injection molding and the metal leadframe 100 can be separately manufactured from a metal sheet. The metal leadframe 100 is rigidly fixed to the second face 16 of the substrate 10 by plastic bumps 102 extending through a though hole of the metal leadframe 100 and partially over the metal leadframe 100, as shown in FIG. 2.

In another manufacturing variant, the substrate 10 is formed by the plastic base 16 overmolded on the metal leadframe 100.

The leadframe 100 is designed with a plurality of electrically conductive paths 104 connecting contacting regions 106, 108 to a first group G1 of contact pins c1 to c7 and a second group G2 of contact pins C1 to C3.

The contacting regions 106 are configured for monitoring the temperature of the AC and DC terminals, in the vicinity of one or more of the recesses 18, 20, 22, 24. The substrate 10 can be provided with a temperature sensor covered with a thermally conductive pad 110 arranged so as to contact an electrical terminal when the substrate 10 is assembled to a charging inlet.

The contacting regions 108, at the recesses 28, 30, are configured for electrically contacting signal pins of a charging inlet, in particular by resilient spring arms 112 configured to clamp a signal pin. Hence, the recesses 28, 30 do not necessarily need to be provided, in addition of the resilient spring arms 112, with snap-fit devices 38, 44, as described with respect to the recesses 18, 20, 22, 24, 26, 32, 34, for maintaining each signal pin.

It is noted that no contacting region is needed at the central recess 26 having the grounding protection function.

An electrical signal from each of the contacting regions 106, 108 can be transmitted to a mating connector of a charging inlet by the contact pins c1 to c7 and C1 to C3. In the example of the first embodiment, the contact pins c1-c7, C1-C3 are flat pins. In a variant not represented, one or more of the contact pins c1-c7, C1-C3 can be a sliding conductor contact having a corrugated flexible legs terminal instead of a flat tab.

The seven contact pins c1 to c7 form the first group G1 of contact pins and are related to the contacting regions 106, 108 of the recesses 18, 20, 22, 24, 26, 28, 30. The three contact pins C1 to C3 form the second group G2 of contact pins and are related to the contacting regions 106 of the recesses 32, 34 foreseen for receiving DC pins. The number of contact pins, the number of contact pins per group and the number of group of contact pins is not limitative.

Each contact pin c1-c7, C1-C3 protrudes outwardly along a mating direction M over a length L3 perpendicularly from a longitudinal lateral side 58 of the substrate 10 (indicated in FIG. 1). The longitudinal lateral side 58 extends along the length L1 of the substrate 10. The longitudinal lateral side 58 is perpendicular to the lateral side 36. As previously mentioned, the longitudinal axis A is parallel to the length L1.

Thus, the contact pins c1-c7, C1-C3 extend perpendicularly to the longitudinal axis A of the recesses 18, 20, 22, 24, 26, 28, 30, 32, 34. Consequently, as the longitudinal axis A is parallel to the locking direction L, the contact pins c1-c7, C1-C3 also extend perpendicularly to the locking direction L. Hence, as the contact pins c1-c7, C1-C3 extend along the mating direction M, the mating direction M is perpendicular to the locking direction L.

The contact pins c1-c7 of the first group are parallel to each other along the mating direction M and are spaced apart along the locking direction L by a predetermined pitch P. In a similar manner, the parallel contact pins C1, C2 and C2, C3 are spaced apart along the locking direction L by the predetermined pitch P. In the example of the first embodiment, the predetermined pitch P is the same for the two groups G1, G2 of contact pins. In a variant, however, the predetermined pitch P could be different between the two groups G1, G2.

The longitudinal length L2 of the recesses 18, 20, 22, 24, 26, 28, 30 is proportional, in particular equivalent, to the length of the predetermined pitch P.

FIG. 3 represents an assembly 200 of the substrate 10 shown of FIG. 1 and FIG. 2 with a housing 300 of a charging inlet for an electric or hybrid vehicle. It is noted that on FIG. 3, only a partial view of the housing 300 is visible. Elements with the same reference sign already described and illustrated in FIG. 1 and FIG. 2 will not be described in detail again but reference is made to their description above.

The housing 300 comprises a cavity 302 delimited by a side wall 304 extending from a base 306. The housing 300 is made of plastic, in particular of an electrically insulating plastic material using injection molding technology.

The base 306 of the housing 300 is provided with a plurality of contact chambers for respectively receiving electrical pins of a charging inlet, like the electrical pins DC+, DC−, AC, G (for ground contact) indicated in FIG. 3. The signal pins are not visible in FIG. 3 because they are hidden behind the base 28A, 30A of the recess 28, 30. It is understood that the number and the type of electrical pins can differ in accordance with the standard of the charging inlet.

As shown in FIG. 3, the side wall 304 of the housing 300 is provided with two mating openings 308, 310 configured for receiving contact pins of a mating connector or a test probe (not represented in FIG. 3, see FIG. 4 and FIG. 5) in the mating direction M.

The mating openings 308, 310 are respectively surrounding by a rim 308A, 310A of length L4 extending along the mating direction M of a mating connector (not represented in FIG. 3) with the housing 300 at the mating openings 308, 310.

In the assembly 200 illustrated by FIG. 3, the substrate 10 is positioned inside the cavity 302 of the housing 300 in an unlocked position of the substrate 10. The second face 14 of the substrate 10 provided with the leadframe 100 faces the base 306 of the housing 300. Hence, the contacting regions 106, 108 provided on the second face 14 (not visible in the view of FIG. 3) of the substrate 10 can be brought in contact with the electrical pins DC+, DC−, AC, G and the signal pins (not visible in the view of FIG. 3).

The mating openings 308, 310 of the housing 300 and the lateral wall 58 of the substrate 10 are arranged in the assembly 200 such that the groups G1, G2 of contact pins respectively protrude towards the mating openings 308, 310 along the mating direction M.

The longitudinal dimension L5 of the mating opening 308 is greater than the distance L6 between the first contact pins c1 and the last contact pin c7 of the first group G1 along the locking direction L.

Respectively, the longitudinal dimension L7 of the mating opening 310 is greater than the distance L8 between the first contact pins C1 and the last contact pin C3 of the second group G2 along the locking direction L.

In particular, the longitudinal dimensions L5, L7 of the mating openings 308, 310 are at least one pitch P longer than the respective distance L6, L8.

As a result, each of the mating openings 308, 310 of the housing 300 is dimensioned to respectively accommodate a mating connector (only represented in FIG. 4 and FIG. 5 by the references 400, 402) comprising at least one more contact pin than the number of contact pins comprised in the respective group G1, G2, the contact pins of said mating connector being spaced apart by the same predetermined pitch P. In the example of the first embodiment, the mating opening 308 has a longitudinal dimension L5 adapted for receiving a mating connector comprising eight contact pins spaced apart by the predetermined pitch P. The mating opening 310 has a longitudinal dimension L7 adapted for receiving a mating connector comprising four contact pins spaced apart by the predetermined pitch P.

FIG. 3 also illustrates a first step of an assembly method according to the present invention. At the first step of the assembly method, the substrate 10 is installed in the cavity 302 of the housing 300 such that the second face 16 faces the base 306 of the housing 300. The AC and ground terminals are inserted through the oblong recesses 18, 20, 22, 24, 26 at their respective end-side E2. Hence, in the unlocked position of the substrate 10, the AC and ground terminals are not fixedly maintained to the substrate 10 by the snap-fit fastening devices 38 provided at the end-side E1, opposite to the end-side E2 along the longitudinal axis A of each oblong recess.

The oblong recess 18, 20, 22, 24, 26 has a shape adapted for allowing a movement, in particular a translation, of the substrate 10 with respect to an electrical pin, the electrical pin generally having a circular cross-section.

The DC+, DC− terminals are positioned at the open-sides 32A, 34A of the open recesses 32, 34. Hence, in the unlocked position of the substrate 10, the DC+, DC− terminals are not fixedly maintained to the substrate 10 in the semi-circular notch 44.

All the contact pins of the groups G1, G2 extend perpendicularly to the longitudinal axis A of the recesses of the substrate 10 respectively towards the mating openings 308, 310. Hence, in the unlocked position, all the contact pins of the groups G1, G2 are rendered accessible to a mating connector from the mating openings 308, 310.

In the unlocked position, as illustrated in FIG. 3, the substrate 10 is not locked to the housing 300. Accordingly, the latching arms 48 of the snap-fit device 46 of the substrate 10 are not locked with a corresponding complementary retaining device 312 of the housing 300 protruding in the aperture 50 of the substrate 10.

The locking of the substrate 10 to the housing 300 can be realized by a translation of the substrate 10 with respect to housing 300 along the locking direction L.

Figure 4:
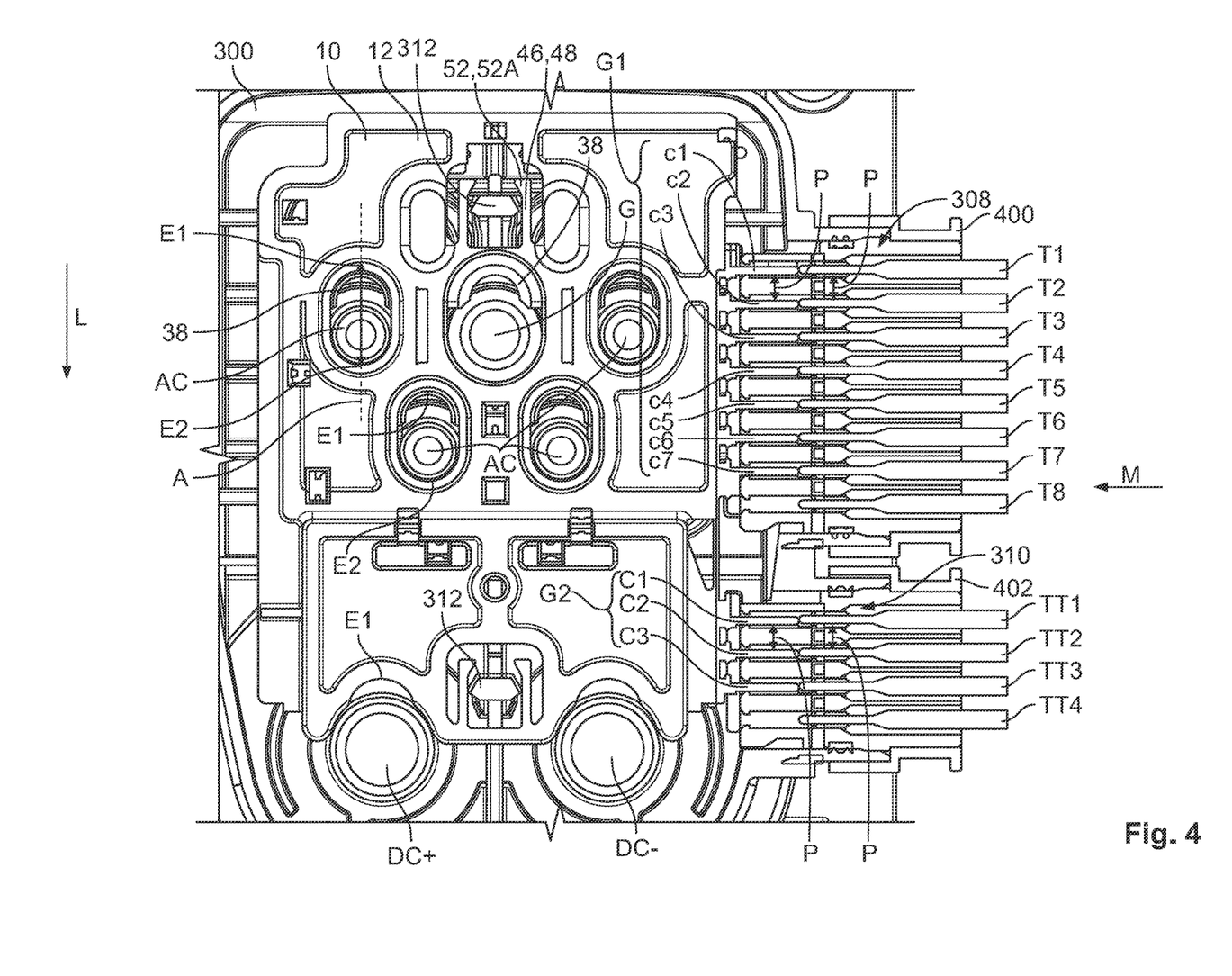
FIG. 4 is a top view of the assembly of FIG. 3 with a test probe, in an unlocked position of the substrate.
Figure 5:
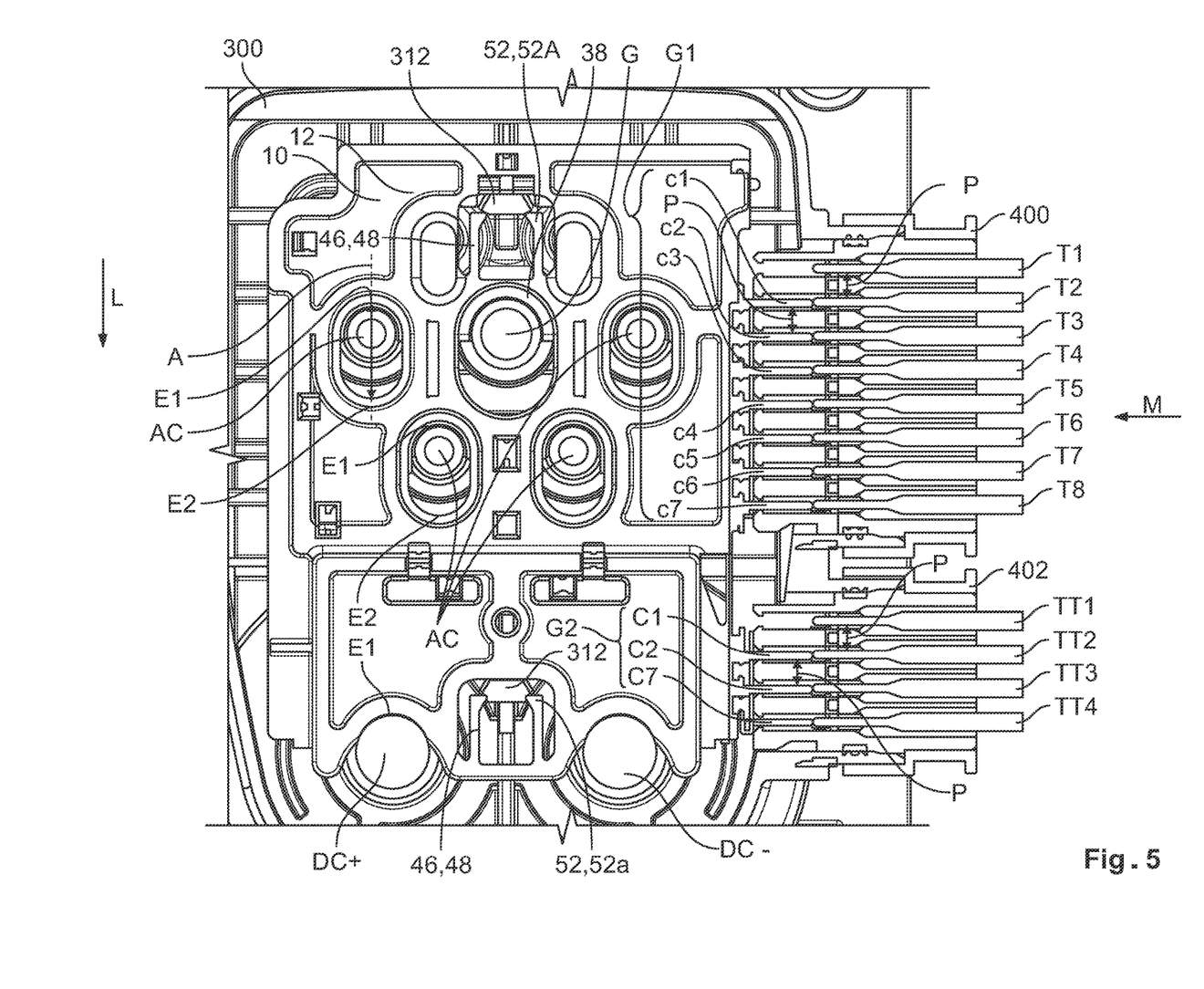
FIG. 5 is a top view of the assembly of FIG. 3 with the test probe, in a locked position of the substrate.

FIG. 4 represents a top view of FIG. 3. FIG. 5 represents a top view of the assembly 200 in the locked position of the substrate 10. The top views of FIG. 4 and FIG. 5 allow better illustrating the movement of the substrate 10 from the unlocked position to the locked position. Elements with the same reference sign already described and illustrated in FIG. 1 to FIG. 3 will not be described in detail again but reference is made to their description above.

A translation along the locking direction L allows to move the substrate 10 from the unlocked position to the locked position as illustrated in FIG. 5.

As mentioned previously, according to the present invention, the locking direction L is perpendicular to the length L3 of the contact pins c1-c7, C1-C3. As a result, according to the present invention, the locking direction L is perpendicular to the mating direction M. The mating direction M is defined as the direction along which the contact pins of a mating connector are insertable into the mating opening 308, 310.

In the locked position, the substrate 10 is locked to the housing 300 by the snap-fit devices 46. As shown in FIG. 5, in the locked position, the hook portions 52A of the latching arms 48 abut on the corresponding complementary retaining devices 312 of the housing 300.

Moreover, in the locked position, the translation of the substrate 10 along the locking direction L with respect to the housing 300 has caused the translation of each recess 18, 20, 22, 24, 26, 28, 30 with respect to the corresponding electrical pins (AC, DC, signal contact) inserted therein. As a result, the corresponding electrical pins (AC, DC, signal contact) are positioned at the end-side E1 of the recesses, i.e. at the end-side of the recesses provided with the snap-fit fastening means 38 or the semi-circular notch 44. Hence, in the locked position, the electrical pins (AC, DC, signal contact) are maintained, in particular by snap-fit connection, i.e. by friction, to the substrate 10. Thus, a movement of the electrical pins (AC, DC, signal contact), that could affect the reliability of the contact with the leadframe 100 (not visible in FIG. 5), can be prevented. Indeed, as the substrate 10 is carrying the contacting regions 106, 108 (not visible in FIG. 5), a stable and reliable electrical and/or thermal contact between the electrical pins (AC, DC, signal contact) and the contacting regions 106, 108 (not visible in FIG. 5) can be obtained by the substrate 10 in the locked position.

The contacting function and the locking function thus advantageously merge in the substrate 10. By the substrate 10, the number of components for a charging inlet for an electric or hybrid vehicle can thus be advantageously reduced, thereby allowing simplifying the assembly and decreasing both the cost and assembly time.

It is noted that the housing 300 can be provided with cover, attached by a snap-fit connection to the housing 300, for partially enclosing the substrate 10. The cover can comprise at least one aperture configured for receiving a tool or a finger for moving the substrate 10 from the unlocked position to the locked position. The cover allows protecting the elements enclosed in the housing 300 without preventing an actuation by an operator of the movement of the substrate 10 from the unlocked position to the locked position. By the substrate 10, the number of components for a charging inlet for an electric or hybrid vehicle can thus be advantageously reduced, thereby allowing simplifying the assembly 200 and decreasing both the cost and assembly time.

Moreover, according to the present invention, the mating direction M is perpendicular to the locking direction L, a movement of the substrate 10 along the locking direction L results in a shift of the contact pins c1-c7; C1, C3 along the locking direction L. The shift of the contact pins c1-c7; C1, C3 along the locking direction L can thus be detected relatively to a fixed reference with respect to the housing 300. A movement of the substrate 10 in the locking direction L causes a shift of the plurality of contact pins c1-c7; C1, C3 by a distance proportional to the predetermined pitch P.

Using contact pins of a test probe as a fixed reference, the structure of the substrate 10, causing the shift of the contact pins c1-c7; C1, C3 from an unlocked position to a locked position, advantageously allows determining the position of the substrate 10 with respect to the housing 300. Hence, a test for determining whether the substrate 10 has been correctly moved in the locked position can be performed.

As the mating opening 308, 310 allows inserting a mating connector or a test probe comprising one more contact pin than the substrate 10, said one more contact pin is necessarily not contacting a contact pin of the substrate 10. By determining the position of the contact pin of a test probe that is not contacting any contact pin of the substrate 10, the position of the substrate 10 with respect to the housing 300 can be determined. The assembly according to the invention therefore allows testing a correct locking of the substrate 10.

For the purpose of illustrating such test, FIG. 4 and FIG. 5 show a first test probe connector 400 inserted in the mating housing 308 and a second test probe connector 402 is inserted in the mating housing 310. The test probe connectors 400, 402 are inserted into the housing 300 along the mating direction M.

In order to detect a shift of the seven contact pins c1-c7 along the locking direction L, the test probe connector 400 comprises one more contact pins than the group G1. As a result, in the example of FIG. 4 and FIG. 5, the test probe connector 400 comprises eight contact pins T1 to T8. For the same reasons, the test probe connector 402 comprises four contact pins TT1 to TT4, i.e. one more than the three contact pins C1, C2, C3 of the group G2.

The contact pins T1 to T8 of the test probe connector 400 are spaced apart with the same pitch than between the contact pins c1-c7 of the group G1, i.e. by the pitch P. Similarly, in the example of FIG. 4 and FIG. 5, the contact pins TT1 to TT4 of the test probe connector 402 are spaced part by the pitch P.

In the unlocked position, as illustrated in FIG. 4:
the contact pin c1 of the substrate 10 is aligned with and contacts the contact pin T1 of the test probe connector 400 along the mating direction M;
the contact pin c2 of the substrate 10 is aligned with and contacts the contact pin T2 of the test probe connector 400 along the mating direction M;
the contact pin c3 of the substrate 10 is aligned with and contacts the contact pin T3 of the test probe connector 400 along the mating direction M;
the contact pin c4 of the substrate 10 is aligned with and contacts the contact pin T4 of the test probe connector 400 along the mating direction M;
the contact pin c5 of the substrate 10 is aligned with and contacts the contact pin T5 of the test probe connector 400 along the mating direction M;
the contact pin c6 of the substrate 10 is aligned with and contacts the contact pin T6 of the test probe connector 400 along the mating direction M;
the contact pin c7 of the substrate 10 is aligned with and contacts the contact pin T7 of the test probe connector 400 along the mating direction M.

As the substrate 10 has one less contact pin than the test probe connector 400, in the unlocked position, the contact pin T8 of the test probe connector 400 is not in contact with a contact pin of the substrate 10. The absence of contact can be identified whether electrically, or mechanically according to probe testing methods of the state of the art.

Similarly, in the unlocked position, as illustrated in FIG. 4:
the contact pin C1 of the substrate 10 is aligned with and contacts the contact pin TT1 of the test probe connector 402 along the mating direction M;
the contact pin C2 of the substrate 10 is aligned with and contacts the contact pin TT2 of the test probe connector 402 along the mating direction M;
the contact pin C3 of the substrate 10 is aligned with and contacts the contact pin TT3 of the test probe connector 402 along the mating direction M.

In the unlocked position, the contact pin TT4 of the test probe connector 402 is not in contact with a contact pin of the substrate 10.

The translation of the substrate 10 with respect to the housing 300 along the locking direction L, which is perpendicular to the mating direction M, causes a displacement of each contact pins c1-c7; C1-C3 of the substrate 10 with respect to the housing 300. On the other hand, the contact pins T1-T7; TT1-TT4 of the testing probe connectors 400, 402 remain fixed with respect to the housing 300 in both the locked position and the unlocked position of the substrate 10.

In particular, the length L2 of the plurality of recesses of the substrate 10 allows a translation of the substrate 10 with respect to the housing 300 of one pitch P along the locking direction L.

As a result, in the locked position, as illustrated in FIG. 5:
the contact pin c1 of the substrate 10 is aligned with and contacts the contact pin T2 of the test probe connector 400 along the mating direction M;
the contact pin c2 of the substrate 10 is aligned with and contacts the contact pin T3 of the test probe connector 400 along the mating direction M;
the contact pin c3 of the substrate 10 is aligned with and contacts the contact pin T4 of the test probe connector 400 along the mating direction M;
the contact pin c4 of the substrate 10 is aligned with and contacts the contact pin T5 of the test probe connector 400 along the mating direction M;
the contact pin c5 of the substrate 10 is aligned with and contacts the contact pin T6 of the test probe connector 400 along the mating direction M;
the contact pin c6 of the substrate 10 is aligned with and contacts the contact pin T7 of the test probe connector 400 along the mating direction M;
the contact pin c7 of the substrate 10 is aligned with and contacts the contact pin T8 of the test probe connector 400 along the mating direction M.

As the substrate 10 has one less contact pin than the test probe connector 400, in the locked position, the contact pin T1 of the test probe connector 400 is not in contact with a contact pin of the substrate 10.

Similarly, in the locked position, as illustrated in FIG. 5:
the contact pin C1 of the substrate 10 is aligned with and contacts the contact pin TT2 of the test probe connector 402 along the mating direction M;
the contact pin C2 of the substrate 10 is aligned with and contacts the contact pin TT3 of the test probe connector 402 along the mating direction M;
the contact pin C3 of the substrate 10 is aligned with and contacts the contact pin TT4 of the test probe connector 402 along the mating direction M.

In the locked position, the contact pin TT1 of the test probe connector 402 is not in contact with a contact pin of the substrate 10.

Hence, from the unlocked position to the locked position, a different contact pin of each of the test probe connectors 400, 402 is not in contact with a contact pin of the substrate 10. It allows deducing the translational position of substrate 10 along the locking direction L within the housing 300.

The present invention further relates to an assembly method for forming the assembly 200 of one of the preceding embodiments, comprising the steps of: a) mounting the substrate 10 on the housing 300 in the unlocked position wherein the at least one contact pin of the substrate 10 extends along the mating direction M towards the mating opening 308, 310 of the housing 300, and then b) moving the substrate 10 with respect to the housing 300 along the locking direction L from the unlocked position to the locked position, the locking direction L being perpendicular to the mating direction M.

Hence, during the assembly, the movement of the substrate 10 towards the locked position allows simultaneously bringing the contacting regions 106, 108 of the leadframe 100 in contact with a corresponding electrical pin and to lock the position of the substrate 10 with respect to the housing 300, thereby preventing an unwanted movement of the contacting regions 106, 108 relative to the electrical pins DC+, DC−, AC, G.

According to one embodiment, after the step a) and prior to the step b), the assembly method can comprise the step of attaching a cover to the housing, in particular by snap fit connection, and step b) comprises moving the substrate 10 along the locking direction L by inserting a tool or a finger through an aperture of said cover.

According to one embodiment, the assembly method can further comprise determining the position of the substrate 10 with respect to the housing 300 by the steps of: c) introducing in the mating opening 308, 310, along the mating direction M, a test probe comprising one more contact pin(s) than a number of contact pins of the substrate 10 facing the mating opening 308, 310, the contact pins of the substrate 10 and the test probe being spaced apart by a same predetermined pitch P, and then d) detecting, electrically and/or mechanically, the position of a contact pin of the test probe that does not contact a corresponding contact pin of the substrate 10.

The step of determining the position of the contact pin of the test probe that is not contacting any contact pin of the substrate 10 allows determining the position of the substrate 10 with respect to the housing 300. Thereby, an easy-to-use and cost effective testing method is provided for testing a correct locking of the substrate 10.

Additional features and advantages of the present invention will be described with reference to the drawings. In the description, reference is made to the accompanying figures that are meant to illustrate preferred embodiments of the invention. It is understood that such embodiments do not represent the full scope of the invention.

What is claimed is:

1. A substrate for contacting an electrical pin arranged in a housing, comprising:
   a base having a recess receiving the electrical pin;
   a metal leadframe having a contacting region electrically and/or thermally contacting the electrical pin, the metal leadframe is rigidly fixed to the base to prevent a relative movement between the metal leadframe and the substrate, the substrate is movable with respect to the housing along a locking direction from an unlocked position where the substrate is not locked to the housing to a locked position in which the substrate is locked to the housing, a movement of the contacting region with respect to the electrical pin is prevented in the locked position; and
   a contact pin extending along a mating direction in a plane parallel to the metal leadframe and configured to electrically contact a mating contact pin of a mating connector.

2. The substrate of claim 1, wherein the recess is an oblong recess having a longitudinal axis extending along the locking direction.

3. The substrate of claim 2, wherein the contact pin protrudes outwardly from the substrate along the mating direction, the mating direction is perpendicular to the longitudinal axis of the recess.

4. The substrate of claim 1, wherein a portion of the recess has a snap-fit fastening device engaging the electrical pin in the locked position.

5. The substrate of claim 4, wherein the snap-fit fastening device is formed by a shoulder partially protruding from a lateral wall defining the recess and in a plane in which the substrate extends.

6. The substrate of claim 5, wherein the shoulder defines a semi-circular notch having a complementary shape with respect to the electrical pin.

7. The substrate of claim 1, wherein the recess is one of a plurality of recesses of the base each receiving an electrical pin, the recesses are each a through recess, a non-through recess, or an open recess with an open side forming a notch in the substrate.

8. The substrate of claim 1, wherein the base is a plastic element overmolded on the metal leadframe.

9. The substrate of claim 1, further comprising a snap-fit device engaged with a complementary retaining device of the housing in the locked position.

10. The substrate of claim 1, wherein the contact pin is one of a plurality of contact pins in a group of the metal leadframe extending parallel to each other from a same side of the substrate.

11. The substrate of claim 10, wherein the contact pins of the group are spaced apart by a predetermined pitch in the locking direction.

12. The substrate of claim 11, wherein the recess is an oblong recess having a longitudinal axis extending along the locking direction, a longitudinal length of the recess along the longitudinal axis is proportional to the predetermined pitch.

13. An assembly, comprising:
   a housing accommodating an electrical pin and having a mating opening receiving a mating contact pin of a mating connector in a mating direction; and
   a substrate contacting the electrical pin arranged in the housing, the substrate including a base having a recess receiving the electrical pin, a metal leadframe having a contacting region electrically and/or thermally contacting the electrical pin, the metal leadframe is rigidly fixed to the base to prevent a relative movement between the metal leadframe and the base, and a contact pin extending along a mating direction in a plane parallel to the metal leadframe and configured to electrically contact the mating contact pin, the substrate is movable with respect to the housing along a locking direction from an unlocked position where the substrate is not locked to the housing to a locked position in which the substrate is locked to the housing, a movement of the contacting region with respect to the electrical pin is prevented in the locked position, the locking direction is perpendicular to the mating direction.

14. The assembly of claim 13, wherein the contact pin is one of a plurality of contact pins in a group of the metal leadframe, and in both the unlocked position and the locked position, the mating opening of the housing faces the contact pins of the group.

15. The assembly of claim 14, wherein the mating opening accommodates the mating connector, the mating contact pin is one of a plurality of mating contact pins of the mating connector, a number of the mating contact pins is at least one more than a number of the contact pins, the mating contact pins and the contact pins are each spaced apart by a same predetermined pitch.

16. The assembly of claim 13, wherein, in the locked position, the substrate is snap-fitted to the housing by engagement of a snap-fit device of the substrate with a complementary retaining device of the housing.

17. The assembly of claim 13, further comprising a cover attached to the housing by a snap-fit connection, the cover partially enclosing the substrate and having an aperture receiving a tool or a finger to move the substrate from the unlocked position to the locked position.

18. A method for forming an assembly, comprising:
mounting a substrate on a housing in an unlocked position, a contact pin of the substrate extends along a mating direction toward a mating opening of the housing;
moving the substrate with respect to the housing along a locking direction from the unlocked position to a locked position in which the substrate is locked to the housing, the locking direction is perpendicular to the mating direction; and
determining a position of the substrate with respect to the housing by:
introducing a test probe in the mating opening along the mating direction, the test probe having one more contact pin than a number of contact pins of the substrate facing the mating opening, the contact pins of the test probe and the substrate are spaced apart by a same predetermined pitch; and
detecting, electrically and/or mechanically, a position of a contact pin of the test probe that does not contact a corresponding contact pin of the substrate.

19. The method of claim 18, further comprising, after the mounting step and prior to the moving step, attaching a cover to the housing by a snap-fit connection, the moving step including moving the substrate along the locking direction by inserting a tool or a finger through an aperture of the cover.

* * * * *